United States Patent [19]
Meyer et al.

[11] Patent Number: 5,901,001
[45] Date of Patent: May 4, 1999

[54] DETECTION OF ASPERITIES IN RECORDING SURFACE OF STORAGE MEDIUM

[75] Inventors: Dallas W. Meyer; Subrahmanyan Nagarajan, both of Burnsville, Minn.; Bo Wei, Daly City, Calif.

[73] Assignee: Seagate Technology, Inc., Scotts Valley, Calif.

[21] Appl. No.: 08/660,063

[22] Filed: Jun. 3, 1996

Related U.S. Application Data

[60] Provisional application No. 60/011,881, Feb. 20, 1996.
[51] Int. Cl.⁶ .............................. G11B 5/02; G11B 27/36
[52] U.S. Cl. ................................. 360/25; 360/31
[58] Field of Search .................... 360/25, 75, 31, 360/113

[56] References Cited

U.S. PATENT DOCUMENTS

| | | | |
|---|---|---|---|
| 4,532,802 | 8/1985 | Yeack-Scranton et al. | 360/25 |
| 4,674,875 | 6/1987 | Koizumi | 356/237 |
| 4,751,441 | 6/1988 | Lewis | 318/439 |
| 4,811,148 | 3/1989 | Aoki et al. | 360/125 |
| 4,812,927 | 3/1989 | Fechner | 360/75 |
| 4,814,908 | 3/1989 | Schmitz | 360/77.02 |
| 4,816,743 | 3/1989 | Harms et al. | 324/56 |
| 4,881,136 | 11/1989 | Shiraishi et al. | 360/25 |
| 4,893,205 | 1/1990 | Hoppe et al. | 360/104 |
| 4,931,338 | 6/1990 | Toffle | 428/65 |
| 4,942,609 | 7/1990 | Meyer | 360/25 |
| 5,012,369 | 4/1991 | Owe et al. | 360/104 |
| 5,270,882 | 12/1993 | Jove et al. | 360/67 |
| 5,339,702 | 8/1994 | Viches | 73/865.9 |
| 5,341,256 | 8/1994 | Murata et al. | 360/75 |
| 5,367,409 | 11/1994 | Ottesen et al. | 360/32 |
| 5,374,946 | 12/1994 | Shirakawa | 346/76 PH |
| 5,410,439 | 4/1995 | Egbert et al. | 360/75 |
| 5,412,519 | 5/1995 | Buettner et al. | 360/73.03 |
| 5,420,736 | 5/1995 | Heim et al. | 360/113 |
| 5,423,111 | 6/1995 | Mori | 29/90.01 |
| 5,424,638 | 6/1995 | Huber | 324/212 |
| 5,450,256 | 9/1995 | Murata et al. | 360/75 |
| 5,455,730 | 10/1995 | Dovek et al. | 360/113 |
| 5,527,110 | 6/1996 | Abraham et al. | 360/75 |
| 5,543,989 | 8/1996 | Westwood | 360/113 |
| 5,560,097 | 10/1996 | Bajhorek et al. | 360/113 |
| 5,581,021 | 12/1996 | Flechsig et al. | 73/105 |
| 5,644,455 | 7/1997 | Schultz | 360/113 |
| 5,666,237 | 9/1997 | Lewis | 360/72.1 X |

FOREIGN PATENT DOCUMENTS 3-178021  8/1991  Japan .

*Primary Examiner*—Aristotelis M. Psitos
*Assistant Examiner*—Regina Y. Neal
*Attorney, Agent, or Firm*—Westman, Champlin & Kelly, P.A.

[57] ABSTRACT

A tester for use in detecting asperities in a disc surface of a storage system includes a load arm having a proximal end and a distal end. The distal end of the load arm is positioned adjacent the disc surface. A slider is carried on the distal end of the load arm adjacent the disc surface. A thermal sensor is coupled to the slider and provides an electrical output in response to a thermal input due to interaction between the thermal sensor and asperity on the disc surface. Detection circuitry coupled to the thermal sensor detects the electrical output from the thermal sensor and responsively provides a detection output indicating the occurrence of an asperity on the disc surface.

15 Claims, 4 Drawing Sheets

DETECTION OF ASPERITIES IN RECORDING SURFACE OF STORAGE MEDIUM

CROSS REFERENCE TO RELATED APPLICATION

This application claims priority from Provisional Application Serial No. 60/011,881 abandoned which is entitled "THERMAL ASPERITY GLIDE TESTING CONCEPTS AND AUTOCALIBRATION" and was filed Feb. 20, 1996.

BACKGROUND OF THE INVENTION

The present invention relates to storage medium of the type which move relative to a transducer. More specifically, the present invention relates to detection of asperities in a recording surface of the storage medium.

Storage mediums are used to store information for later retrieval. For example, magnetic discs are a type of storage medium in which a surface of the disc carries magnetically encoded information. The disc is rotated at a high speed and a magnetic transducer (a head) is positioned to "fly" just over the surface of the rotating disc. The head is used to write information onto the surface of the disc by changing the magnetization across the surface of the disc. Information is then read back from the disc by the head which detects the changes in the magnetization carried on the disc surface. One type of head is a thin film inductive head which can be used for both reading and writing magnetically encoded information. Another type of head is a magnetoresistive sensor which has a resistance which changes in response to an external magnetic field. Binary information is stored on the disc surface as a series of flips in the direction of magnetization across the surface.

The technology in this area has been moving toward ever increasing levels of storage density. Increased storage density is achieved by placing more magnetically encoded information in a given area on the disc surface. In order for the transducing head to properly record and read back this information, the head must be placed extremely close the disc surface. This is achieved by allowing the head to "fly" over the disc surface as the disc rotates at high speed. The flying is due to the hydrodynamic properties of the air passing between the slider and the disc.

The distance between the head/slider assembly and the disc surface is extremely small. A minor asperity in the surface of the disc can cause catastrophic damage to the head, and/or disc surface, leading to failure of the storage system. Thus, tests have been developed which detect asperities in the surface of the magnetic disc. Typically, the prior art has detected asperities by monitoring vibrations induced in the head due to an impact or an interference between the asperity and the slider. One prior art technique uses a piezoelectric element which is attached to the slider. When the slider contacts the medium, the head vibrates causing the piezoelectric element to generate an AC signal. The time at which the AC signal is detected can be used to identify the location of the asperity on the disc surface because at that moment the asperity will have just passed the location of the piezoelectric element. Further, the size of the asperity can be determined by noting the amplitude of the AC signal.

Another technique for identifying asperities in a disc surface is described in U.S. Pat. No. 4,881,136, issued Nov. 14, 1989 to Shiraishi et al. entitled "METHOD AND APPARATUS FOR DETECTING MINUTE DEFECTS ON MAGNETIC DISC BY MONITORING BOTH AMPLITUDE DECREASE AND PHASE SHIFT OF A REPRODUCED SIGNAL". A somewhat related technique is described in U.S. Pat. No. 4,942,609, issued Jul. 17, 1990 to Meyer entitled "ELECTRONIC FLYING INTEGRITY TESTER FOR DISC DRIVE". Both of these systems monitor the output of a transducing head. As the transducing head passes over the magnetized disc surface, the output from the head changes in response to stored information. However, if the head passes over or impacts an asperity, the output signal from the transducing head will change substantially. The amplitude of the output signal will change as the distance between the head and the disc surface changes. Additionally, a sinusoidal signal will be superimposed on the output signal as the head oscillates or rings after the interference with the asperity. Commercial systems are available from Phase Metrics of San Diego, Calif. and Hitachi of Tokyo, Japan. In all of these techniques, if the asperity is larger than a desired threshold, the test, which is referred to as a glide test, is considered a failure. Further, the significance of accurate glide tests is becoming increasingly important as the flying height becomes less.

Prior art glide testers suffer from a number of problems. In order to detect small defects, the glide tester must have a good response to high frequency signals. However, this response is difficult to control during manufacturing of the tester. Additionally, there is a lack of linearity in the size of the response and the size of the asperity. This lack of linearity makes it difficult to determine the threshold for detecting a failure. The testers typically use a calibration disc carrying calibration asperities which are small bumps ranging from 4 to 12 mils. However, bumps with differing aspect ratios cause the sensor to respond in different ways making the calibration curve generated from such a calibration disc valid for only a certain type of defect. Furthermore, the sensitivity of the glide tester varies during the course of testing and depends upon the fly height, head contamination and damage, mechanical damage, etc. Additionally, in a prior art glide tester, a damaged sensor may go undetected. This will cause all subsequent discs to pass the glide test, regardless of their condition.

SUMMARY OF THE INVENTION

The present invention is an apparatus for detecting asperities in a rotating disc surface of a disc storage system. In the apparatus, a load arm has a proximal end and a distal end which is placed adjacent to the surface of the disc being tested. A slider carried on the distal end of the load arm is positioned to fly over the disc surface. A thermal sensor is coupled to the slider proximate the disc surface. When the thermal sensor interacts with an asperity on the disc surface, the energy which is generated due to the interaction causes heating of the thermal sensor. The thermal sensor changes resistance in response to this heating. Detection circuitry is coupled to the thermal sensor and is used to detect the heating of the thermal sensor by monitoring the resistance change. The detection circuitry responsively provides a detection output which indicates that the thermal sensor has interacted with an asperity on the rotating disc surface. In one preferred embodiment, the thermal sensor is a magnetoresistive sensor which changes resistance in response to heating. In one embodiment, the thermal sensor is calibrated by heating the thermal sensor with a known heat source and monitoring the electrical output.

DETAILED DESCRIPTION OF THE PREFERRED EMBODIMENTS

Figure 1:
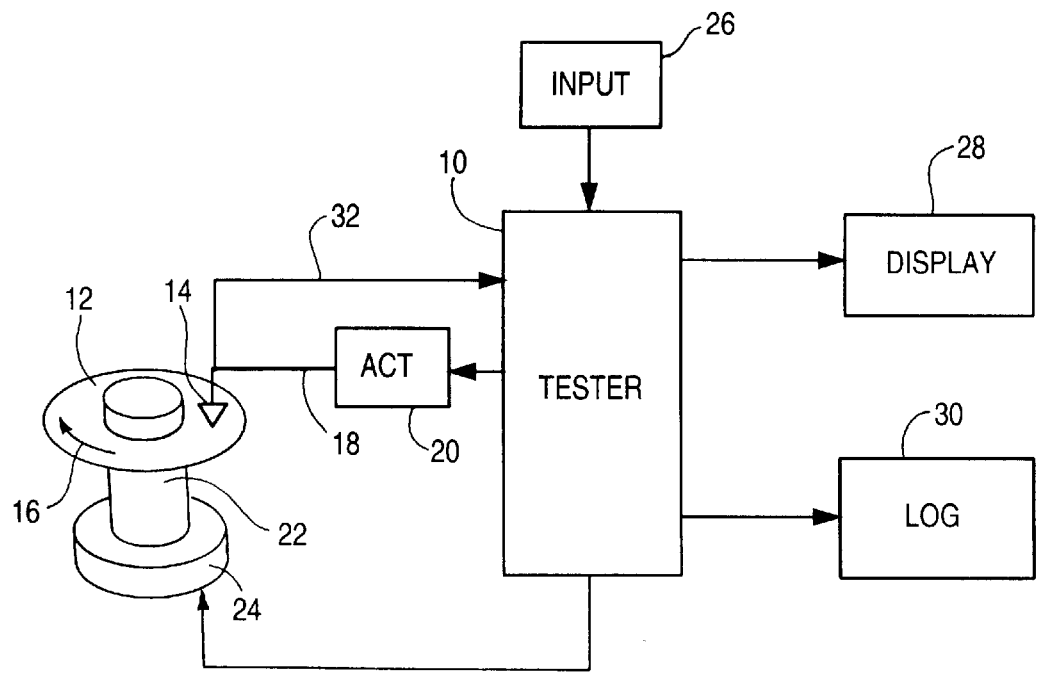
FIG. 1 is a simplified block diagram of a glide tester in accordance with the present invention for locating asperities on the surface of a storage disc.

FIG. 1 is a simplified block diagram showing a glide tester 10 in accordance with the present invention for locating and identifying asperities carried on the surface of magnetic storage disc 12. A thermally sensitive head 14 is positioned to "fly" over the surface of disc 12 while disc 12 rotates in the direction shown by arrow 16. Head 14 is carried on actuator arm 18 coupled to actuator 20. Disc 12 is carried on spindle 22 coupled to spindle motor 24 which causes rotation of disc 12. Tester 10 connects to actuator 20 and spindle motor 24. Tester 10 also connects to input 26, display 28 and log 30. Tester 10 receives an output signal 32 from head 14. In operation, and as described in greater detail herein, tester 10 detects asperities carried on surface 12 by monitoring the output 32 from head 14. When head 14 impacts an asperity carried on disc surface 12, an output is provided on output 32. Tester 10 operates in accordance with input instructions provided by input 26 which may be, for example, a user input. Tester 10 also controls positioning of head 14 by operating actuator 20 and by controlling spindle motor 24. Information related to detection of an asperity can be displayed on display 28 and stored in log 30.

Figure 2:
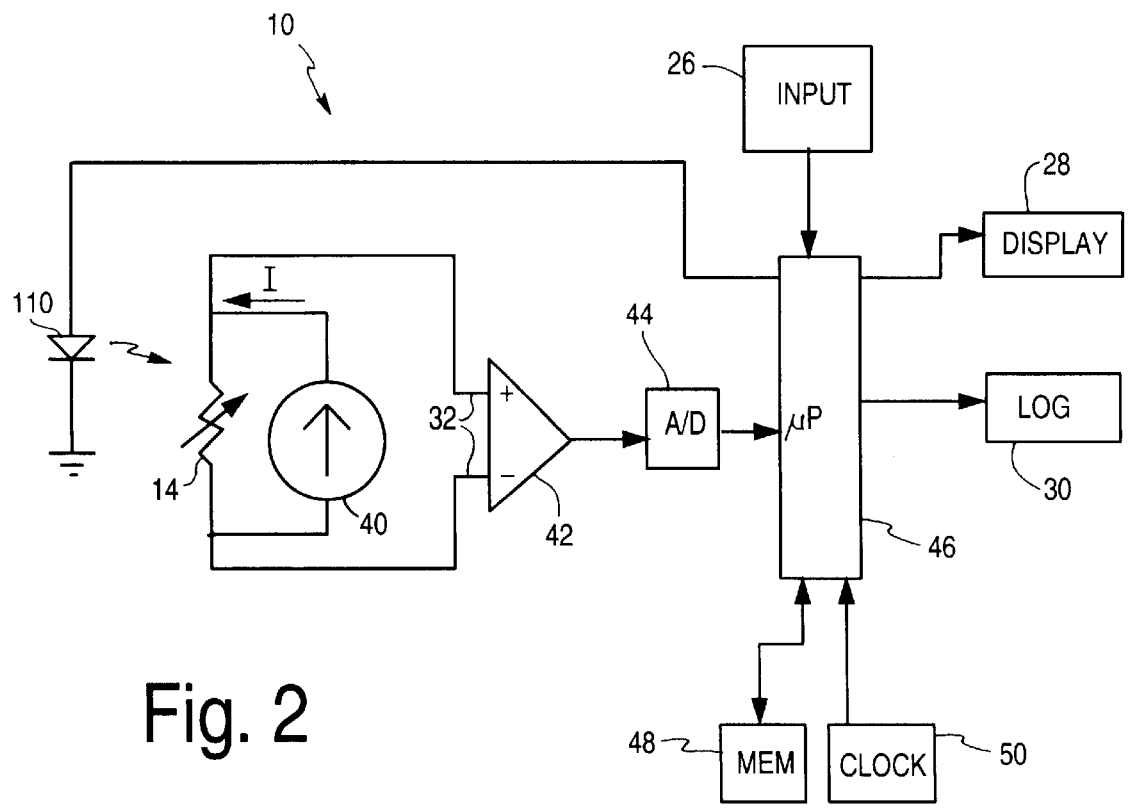
FIG. 2 is a block diagram showing operation of a glide tester in accordance with the present invention.

FIG. 2 is a block diagram showing operation of glide tester 10 in accordance with the present invention. In a preferred embodiment, sensor 14 is a thermal resistive element having a resistance which varies with temperature. A current I is applied to sensor 14 by current source 40. Output 32 is a differential output provided to the inverting and non-inverting inputs of a high impedance differential amplifier 42. The output from amplifier 42 is provided to analog to digital converter 44 which provides a digital output to microprocessor 46. Microprocessor 46 is connected to input 26, display 28 and log 30 shown in FIG. 1. Microprocessor 46 also connects to memory 48 and system clock 50. Memory 48 contains software instructions which control operation of microprocessor 46 which operates at a speed determined by clock 50. Microprocessor 46 also includes connections (not shown in FIG. 2) to actuator 20 and spindle motor 24 shown in FIG. 1. Microprocessor 46 calculates the resistance R of sensor element 14. Microprocessor 46 measures the voltage drop V across sensor 14 using differential amplifier 42 and analog to digital converter 44. If the current I generated by current source 40 is known (either stored in memory 48, measured by microprocessor 46, or set by microprocessor 46), the value of R is calculated as V/I.

Figure 3:
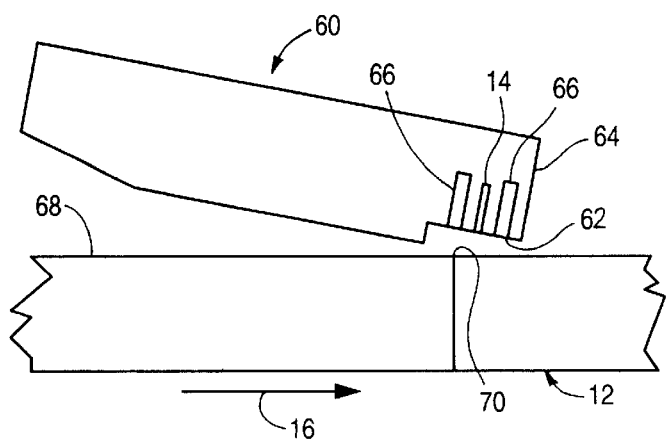
FIG. 3 is a side plan view showing a slider carrying a sensor element over a disc surface in accordance with the present invention.
Figure 4:
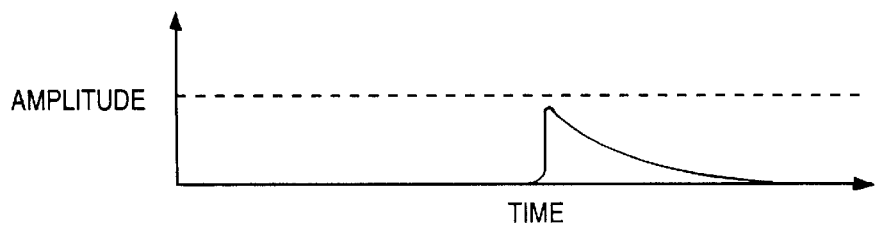
FIG. 4 is a graph showing amplitude versus time from an output signal of a sensor element in accordance with the invention.

In the present invention, a thermal resistive sensor is provided by, for example, a magnetoresistive sensor. A magnetoresistive sensor has a resistance which changes in response to an applied magnetic flux. However, most magnetoresistive sensors also have a property in which the resistance of the sensor changes in response to changes in temperature, such as those which occur when the sensor interacts with a defect or asperity on the surface of a disc. FIG. 3 is a side elevational view of sensor 14 proximate disc 12. Sensor 14 is carried on slider 60 and is positioned in a recess 62 at the trailing edge 64 of slider 60. Slider 60 also carries shields 66 which shield element 14, in this example a magnetoresistive element. Disc 12 includes disc surface 68 which includes asperity 70. FIG. 4 is an example of the output from amplifier 42 versus time when magnetoresistive sensor 14 interacts with asperity 70. As shown in FIG. 4, the output shows a step response to a maximum amplitude which decays exponentially with time as the heat dissipates from sensor 14.

In the present invention, asperities are located by monitoring the output of the sensor element using any appropriate monitoring technique. For example, by comparing the signal to the threshold, examining the shape of the output signal, performing spectral analysis, measuring the duration of pulses or spikes in the output, decay rates, measure the amplitude and/or frequency of the output signal. All of these techniques alone or in combinations, are considered to be within the scope of this invention.

Figure 5:
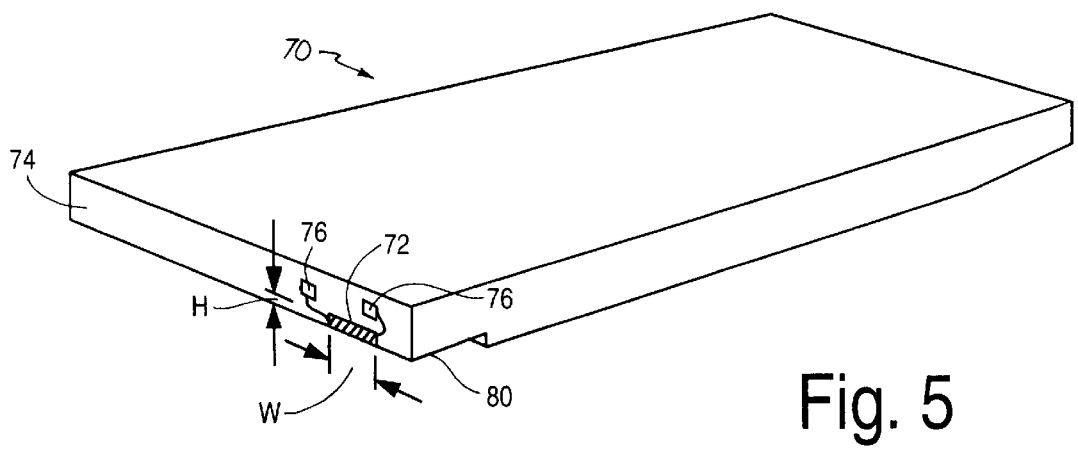
FIG. 5 is a top perspective view showing the trailing edge of a slider carrying a sensor element in accordance with the present invention.

FIG. 5 is a rear perspective view of a slider 70 in accordance with another embodiment. Slider 70 carries thermal resistive element 72 at its trailing edge 74. Element 72 is preferably a non-magnetic material which has a resistivity which is highly dependent upon temperature. Examples of such material include silver and copper which have ΔR/R ratios which are greater than 2. NiFe may also be used. In a preferred embodiment, the width W of element 72 is between 75 and 100 μm, the height H is less than about 2 μm and the thickness is less than about 100 Å. Electrical contact pads 76 are provided to provide electrical contact to element 72. In a preferred embodiment, element 72 has a resistance which does not change in response to an applied magnetic flux. This allows the sensor element 72 to be used with discs that contain data written on the surface. In a preferred embodiment, the distance between sensor element 72 and disc surface 68 is greater than 75 μm. Sensor height H and thickness are controlled to maximize the sensitivity to thermal spikes on the air bearing surface of slider 70. As shown in FIG. 5, a recess 80 is provided at the trailing edge of slider such that sensor element 72 is slightly recessed. A thin layer of diamond-like carbon or other wear-resistant coating may be applied to the air bearing surface of slider 70 to protect element 72 when it contacts asperities on the surface 68 of disc 12. In another embodiment, a two rail slider may be used carrying two sensor elements.

Figure 6:
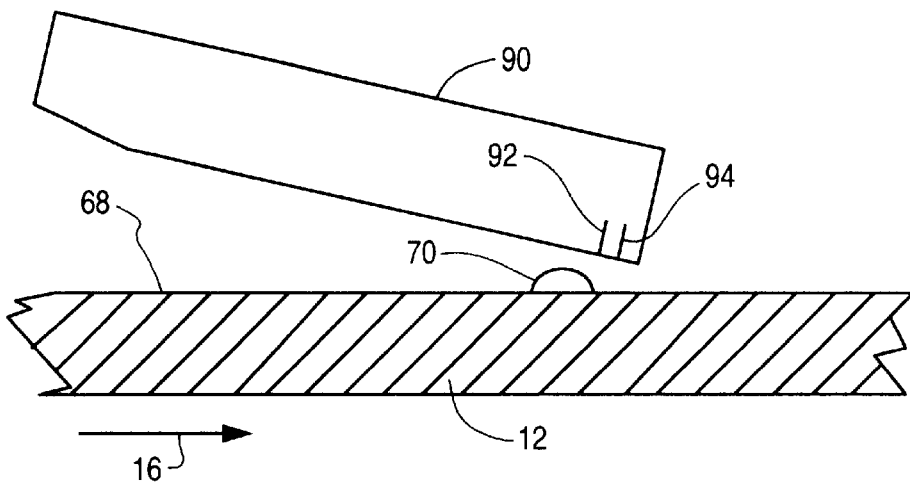
FIG. 6 is a side plan view showing a slider carrying sensor elements approximate a disc surface in accordance with the present invention.
Figure 7:
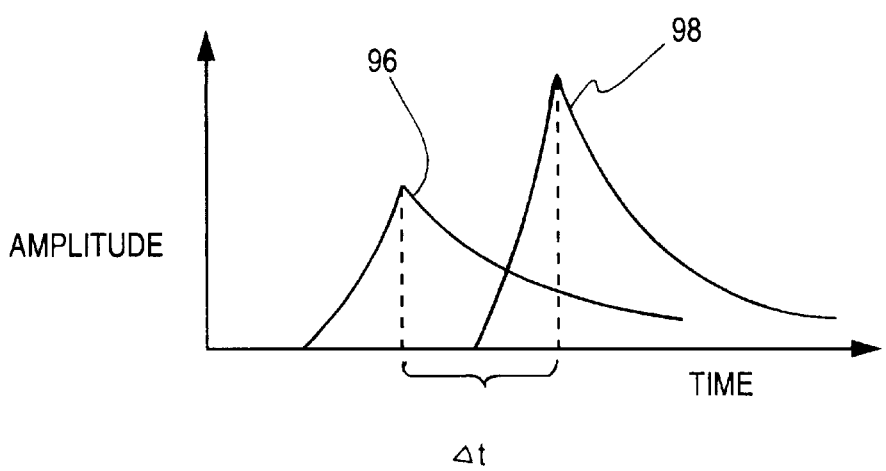
FIG. 7 is a graph of amplitude versus time of the sensor elements shown in FIG. 6.

FIG. 6 is a side view of a slider 90 in accordance with another embodiment. Slider 90 includes sensor elements 92 and 94 in accordance with the present invention. Sensor elements 92 and 94 provide two outputs upon encountering asperity 70. The outputs from sensors 92 and 94 are shown in FIG. 7 as outputs 96 and 98, respectively. FIG. 7 is graph of amplitude versus time. The amplitude of the output signals and the time (Δt) between the peaks in signals 96 and 98 can be used by microprocessor 46 to determine the size and location of asperity 70.

In a preferred embodiment, the air bearing surface of the slider should be designed for a very stiff response for tight fly height control. Thirty percent sliders could be used to reduce the sensitivity of the head to waviness in the disc surface.

One aspect of the present invention is the ability to calibrate the sensor. In one embodiment, microprocessor 46 monitors the resistance R of element 14. If a permanent resistance change is measured, microprocessor 46 provides an output indicating that the sensor element 14 has been damaged and should be replaced. In another embodiment, a laser diode 110 shown in FIG. 2 is positioned to irradiate sensor 14. Laser diode is connected to microprocessor 46 and is used to provide an energy pulse to element 14. By monitoring the output from differential amplifier 42, microprocessor 46 can determine if element 14 is damaged and can calibrate element 14. Additionally, if laser diode 110 is focused at element 14 when element 14 is withdrawn from disc by actuator 20 as shown in FIG. 1, laser diode 110 can be used as a position calibrator for element 14. In other words, by monitoring the output from amplifier 42 as element 14 is moved by actuator 20, the position of element 14 relative to laser diode 110 can be determined and stored by microprocessor 46 for use in determining the exact location of an asperity on the surface of disc 12. The location of the asperity is determined by determining the position of element 14 based upon position information provided to actuator 20 and motor 24.

Figure 9:
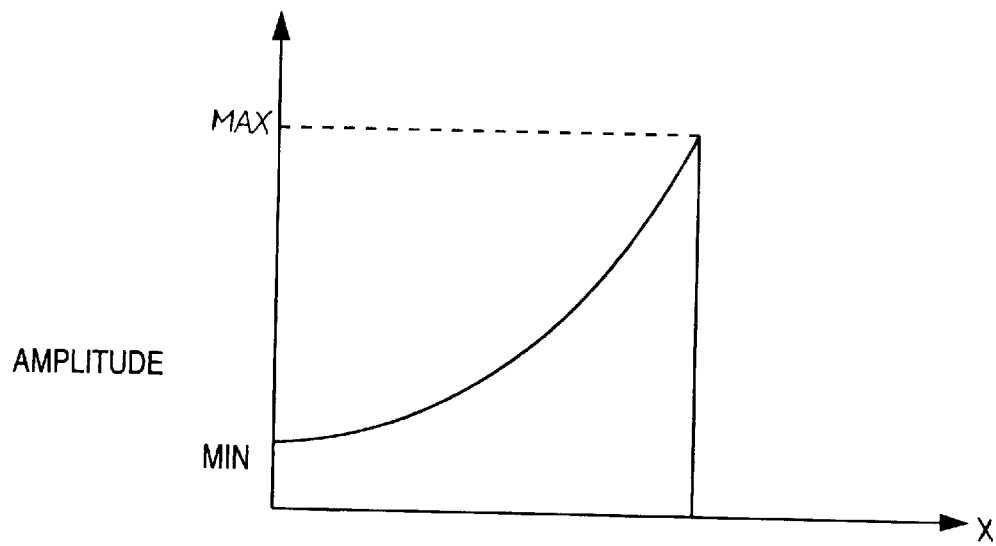
FIG. 9 is a graph of amplitude versus position for the slider of FIG. 8.
Figure 8:
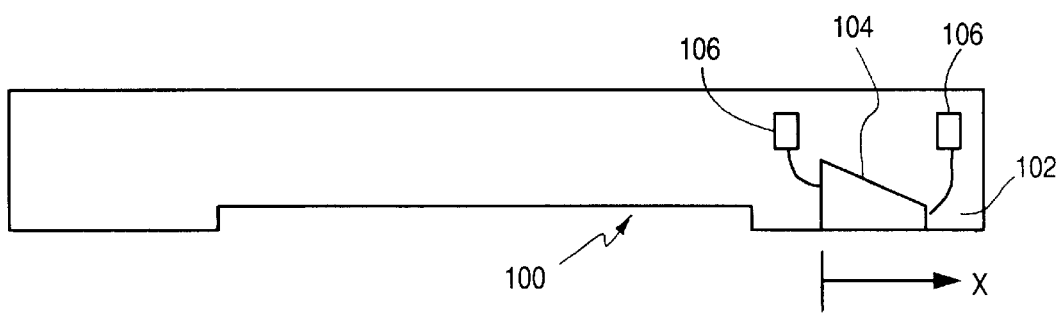
FIG. 8 is a rear elevational view of an asperity tester in accordance with another embodiment.

FIG. 8 is a rear elevational view of an asperity detector in accordance with another embodiment. In FIG. 8, slider 100 includes rail 102 carrying slanted sensor element 104. Electrical contacts 106 connect to opposing sides of element 104. The percent change in resistance of element 104 when it encounters an asperity is dependent on the radial position (shown as x in FIG. 8) of the asperity relative to sensor 104. The thinner portion of the sensor provides a greater percentage change in resistance when it encounters the asperity than the thicker portion of the sensor element 104. This is illustrated in the graph FIG. 9 which is a graph of resistance of sensor element 104 versus position (x) as shown in FIG. 8. This information can be used to determine position of the asperity using multiple passes and the minimum and maximum amplitude values can be indicative of defects or damage to sensor element 104.

The present invention provides a number of advantages. These include the ability to perform diagnostics on the glide tester, the ability to calibrate the position of the sensor element, and insensitivity of the sensor element to magnetic fields. It is understood that different types of heat sensitive elements and sliders may be used. Furthermore, it should be understood that other types of testing apparatus may be used in accordance with the present invention and the results of the test may be used in any appropriate manner.

Although the present invention has been described with reference to preferred embodiments, workers skilled in the art will recognize that changes may be made in form and detail without departing from the spirit and scope of the invention.

What is claimed is:

1. An apparatus for detecting asperities in a rotating disc surface of a disc storage system, the apparatus comprising;
    a load arm having a proximal end and a distal end adjacent the disc surface;
    a slider carried on the distal end of the load arm adjacent the disc surface;
    a first thermal sensor element coupled to the slider providing a first electrical output in response to a thermal energy input to the first thermal sensor by physical contact of the first sensor with a moving asperity on the rotating disc surface;
    a second thermal sensor element coupled to the slider adjacent the first thermal sensor providing a second electrical output in response to a thermal energy input to the second thermal sensor by physical contact of the second sensor with the moving asperity on the rotating disc surface; and
    detection circuitry coupled to the first and second electrical outputs of the first and second thermal sensors detecting the thermal inputs and responsively providing a detection output indicating an occurrence and a location of an asperity on the rotating disc surface.

2. The apparatus of claim 1 wherein the electrical output of the first and second thermal sensor elements comprises electrical resistance.

3. The apparatus of claim 1 including:
    a current source for transmitting a current through the first and second thermal sensor elements, wherein the detection circuitry detects voltage drop across each of the first and second sensor elements.

4. The apparatus of claim 1 wherein the first and second thermal sensor elements comprise Silver.

5. The apparatus of claim 1 wherein the first and second thermal sensor elements comprise Copper.

6. The apparatus of claim 1 wherein the detection circuitry includes a microprocessor coupled to an actuator for positioning the load arm and a motor for rotating the disc and the microprocessor determines location of the asperity on the disc surface based upon slider position.

7. The apparatus of claim 6 including a heating element responsive to a signal from the microprocessor and positioned at a known location relative to the disk surface to heat the thermal sensor element and calibrate position of the slider to provide position calibration information to the defection circuitry, and wherein the microprocessor determines location of the asperity on the disk based upon slider position and the position calibration information.

8. The apparatus of claim 7 wherein the sensor element comprises a thin strip of conductive material carried on a trailing edge of the slider.

9. The apparatus of claim 1 including a heating element to heat the first and second thermal sensor elements and wherein the detection performs diagnostics on the first and second sensor elements by application of heat with the heating element.

10. The apparatus of claim 7 or 9 wherein the heating element comprises a laser diode.

11. The apparatus of claim 1 including a protective coating of diamond-like-carbon covering the sensor element.

12. An apparatus for detecting asperities in a rotating disc surface of a disc storage system as is claim 1, wherein the detection circuitry determines the size and/or location of the asperity using a time difference between a first peak amplitude of the first electrical output and a second peak amplitude of the second electrical output.

13. A method of detecting asperities on a disc surface of a disc storage system, the method comprising the steps of:
    providing a slider carried on the distal end of a load arm, the slider including a first and a second thermal sensor disposed adjacent the disc surface;
    rotating the disc surface;
    detecting an asperity on the disc surface as indicated by first and second electrical outputs generated in response to thermal energy inputs to the sensors from physical contact of the sensors with the moving asperity on the disc surface; and determining the size and location of the asperity using a time difference between a first and a second peak amplitude of the first and second electrical outputs, respectively.

14. An apparatus for detecting asperities on a rotating disc surface of a disc storage system, the apparatus comprising:

a load arm having a proximal end and a distal end adjacent the disc surface;

a slider carried on the distal end of the load arm adjacent the disc surface;

a thermal sensor element coupled to the slider providing an electrical output in response to a thermal energy input to the thermal sensor by physical contact with a moving asperity on the rotating disc surface;

detection circuitry coupled to the electrical output of the thermal sensor element and responsively providing a detection output indicating an occurrence of an asperity on the rotating disc surface, the detection circuitry including a microprocessor coupled to an actuator for positioning the load arm and a motor for rotating the disc wherein the microprocessor determines location of the asperity on the disc surface based upon slider position and position calibration information; and a heating element responsive to a signal from the microprocessor and positioned at a known location relative to the disc surface to heat the thermal sensor element and calibrate position of the slider to provide position calibration information to the detection circuitry.

15. An apparatus for detecting asperities on a rotating disc surface of a disc storage system as in claim 14, wherein the heating element comprises a laser diode.

* * * * *